United States Patent
Hao-Der et al.

(10) Patent No.: US 7,782,615 B1
(45) Date of Patent: Aug. 24, 2010

(54) ELECTRONIC DEVICE AND COOLING SYSTEM THEREOF

(75) Inventors: Cheng Hao-Der, Taipei Hsien (TW); Hung-Chou Chan, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/489,454

(22) Filed: Jun. 23, 2009

(30) Foreign Application Priority Data

Mar. 26, 2009 (CN) .......................... 2009 1 0301146

(51) Int. Cl.
    *H05K 7/20* (2006.01)
(52) U.S. Cl. ................... 361/695; 361/716; 361/720; 361/721; 454/184; 165/122; 174/16.1
(58) Field of Classification Search ................ None
    See application file for complete search history.

(56) References Cited

U.S. PATENT DOCUMENTS

| | | | | |
|---|---|---|---|---|
| 5,428,503 A | * | 6/1995 | Matsushima et al. | 361/695 |
| 6,163,454 A | * | 12/2000 | Strickler | 361/695 |
| 6,222,729 B1 | * | 4/2001 | Yoshikawa | 361/695 |
| 7,061,761 B2 | * | 6/2006 | Tucker et al. | 361/695 |
| 7,369,406 B2 | * | 5/2008 | Matsushima et al. | 361/695 |
| 7,436,663 B2 | * | 10/2008 | Matsushima et al. | 361/695 |
| 7,495,906 B2 | * | 2/2009 | Fujie et al. | 361/679.49 |
| 2005/0264995 A1 | * | 12/2005 | Hanson | 361/695 |
| 2009/0016019 A1 | * | 1/2009 | Bandholz et al. | 361/695 |
| 2010/0073872 A1 | * | 3/2010 | Pakravan | 361/695 |
| 2010/0097760 A1 | * | 4/2010 | Azar et al. | 361/695 |

* cited by examiner

*Primary Examiner*—Boris L Chervinsky
(74) *Attorney, Agent, or Firm*—Raymond J. Chew

(57) ABSTRACT

An electronic device with a cooling system includes an enclosure. A first electronic component and a second electronic component in parallel are received in the enclosure. Air inlets are defined in a front board of the enclosure to receive cool air. A first flow of the cool air passes through a main airflow path to cool the first electronic component and the second electronic component. A second flow of the cool air passes through an auxiliary airflow path to cool the second electronic component. The main airflow path and the auxiliary airflow path are separated by a clapboard. The cool air heated by the first and second electronic components is then exhausted through the air outlets defined in a back board of the enclosure.

13 Claims, 2 Drawing Sheets

ELECTRONIC DEVICE AND COOLING SYSTEM THEREOF

BACKGROUND

1. Technical Field

The present disclosure relates to electronic devices, and particularly to an electronic device with a cooling system.

2. Description of Related Art

In some electronic device, such as a server or a computer, electronic components, such as hard disks, are installed. Generally, the electronic components in the electronic devices are arranged in rows. Usually air cooling is used in the electronic devices via air inlets to cool the electronic components. However, the electronic components in rows not first in the path of the airflow cannot be effectively cooled because the air is heated by the electronic components in the rows in the path first. Therefore, service life of the electronic components in the back rows may be shortened.

DETAILED DESCRIPTION

Figure 1:
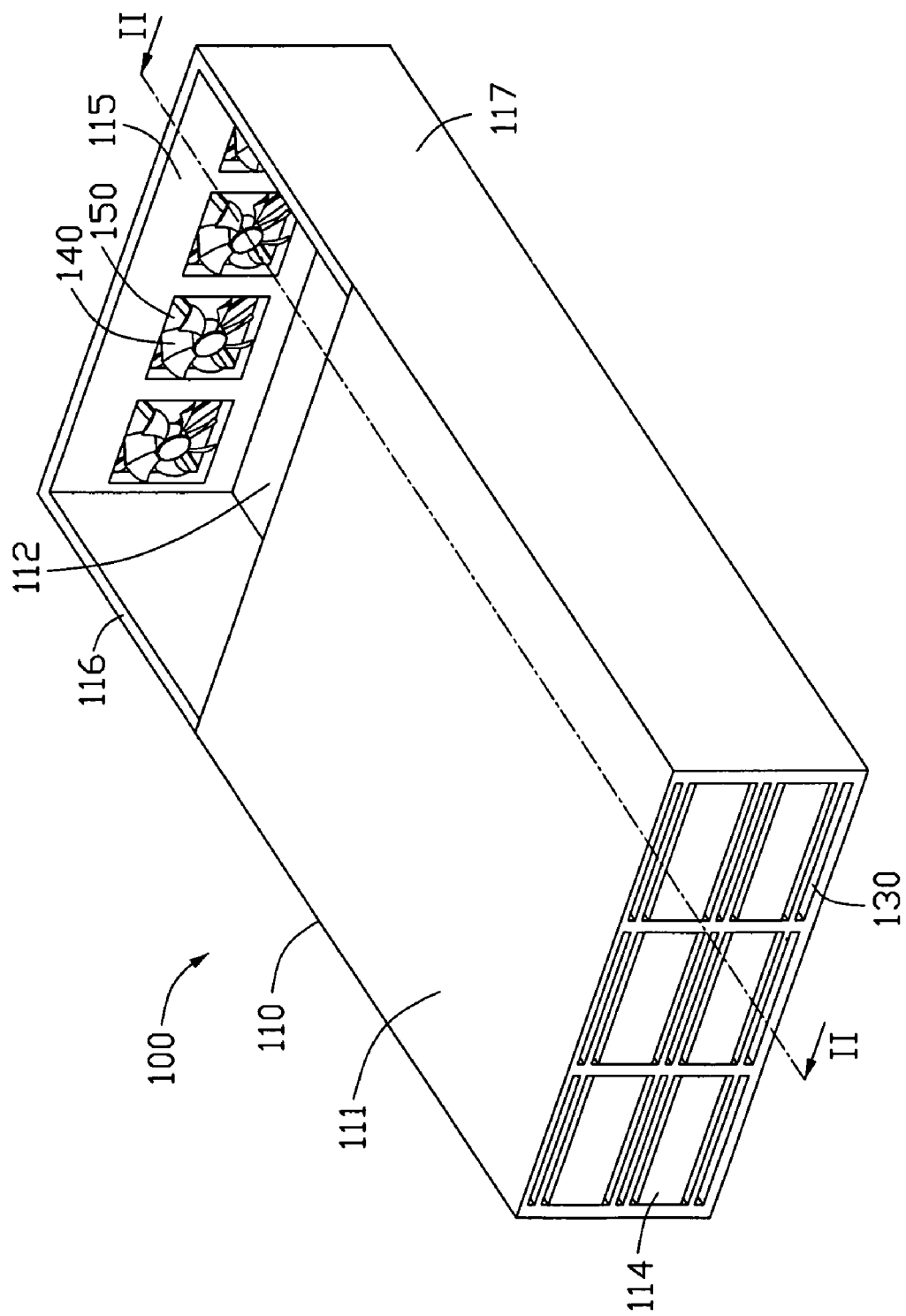
FIG. 1 is an isometric view of an exemplary embodiment of an electronic device.
Figure 2:
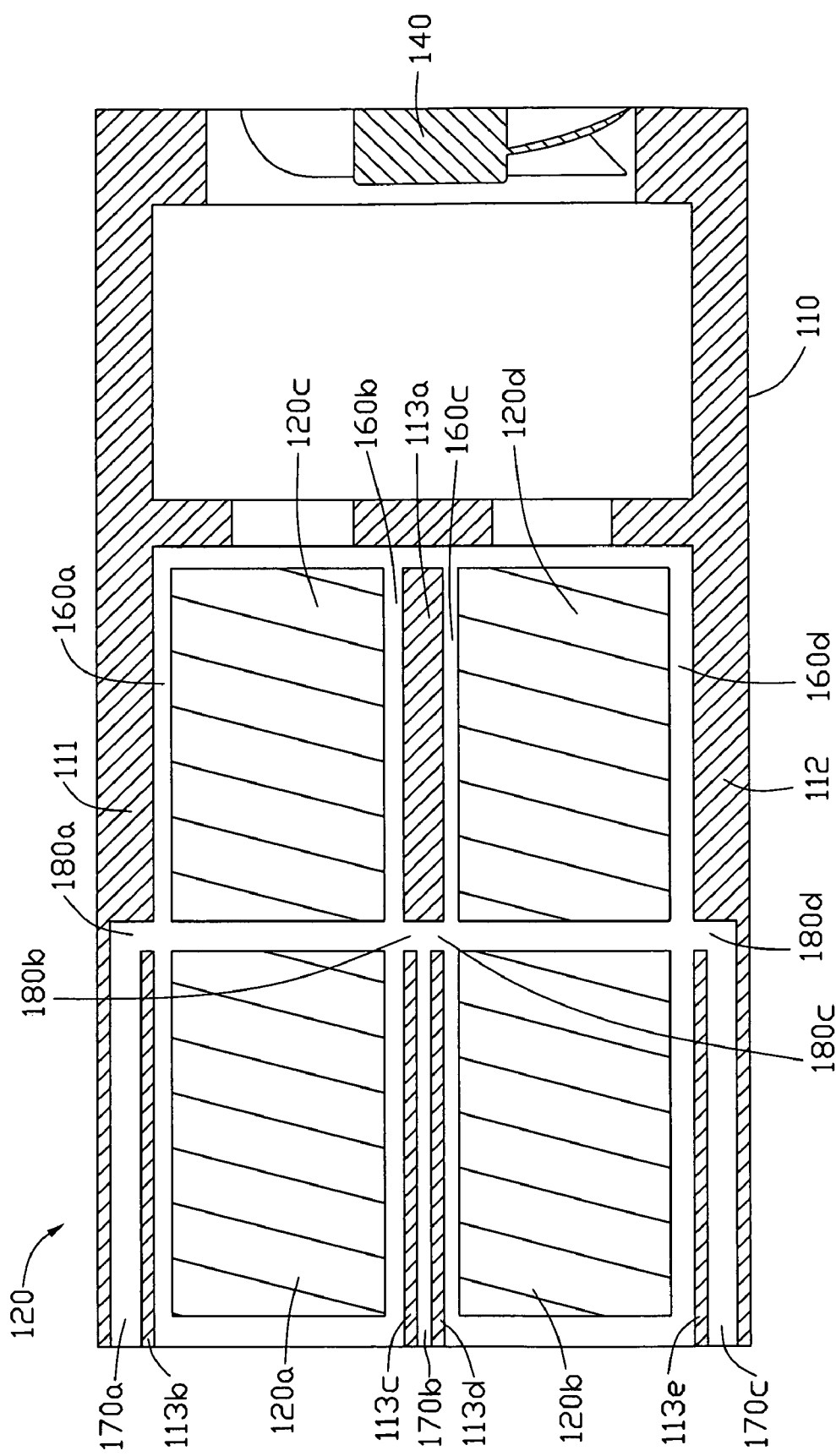
FIG. 2 is a cross-sectional view of FIG. 1, taken along the line II-II.

Referring to FIG. 1 and FIG. 2, an exemplary embodiment of an electronic device 100 includes a cooling system 120 and a plurality of electronic components 120a-120d. The cooling system 120 includes an enclosure 110, a plurality of fans 140, and a plurality of first clapboards 113b-113e. The enclosure 110 includes a front board 114, a back board 115, two side boards 116 and 117, a top board 111, a bottom board 112 parallel to the top board 111, and a second clapboard 113a. The second clapboard 113a is located between and parallel to the top board 111 and the bottom board 112. The top board 111, the bottom board 112, and the second clapboard 113a function as a board module of the enclosure 110. Depending on the embodiment, the plurality of electronic components 120a-120d may comprise one or more hard disk drives, optical drives, processors, and/or memory systems, for examples.

A plurality of air inlets 130 are defined in the front board 114 of the enclosure 110. Cool air is directed through the enclosure 110 through the plurality of air inlets 130, to cool the electronic components 120a-120d.

A plurality of air outlets 150 is defined in the back board 115 of the enclosure 110. Each of the fans 140 is correspondingly fixed to one of the air outlets 150. The cool air passing through the enclosure is exhausted through the air outlets 150. In another exemplary embodiment, the plurality of fans 140 can be fixed to other places, such as the back of the electronic component 120c or 120d, and also adjacent to the plurality of air outlets 150.

The second clapboard 113a separates a rear portion of the enclosure 110 into two parts. The electronic components 120c and 120d are accommodated in the enclosure 110, respectively between the top board 111 and the second clapboard 113a, and between the bottom board 112 and the second clapboard 113a. The first clapboard 113b is located in the front portion of the enclosure 110 adjacent to the top board 111. The first clapboard 113e is located in the front portion of the enclosure 110 adjacent to the bottom board 112. The first clapboards 113c and 113d are parallel located between the first clapboards 113b and 113e. The electronic component 120a is fixed between the first clapboards 113b and 113c. The electronic component 120b is fixed between the first clapboards 113d and 113e. Therefore, the electronic components 120a-120d are separated into two rows by the second clapboard 113a and the first clapboards 113b-113e.

The cooling system 120 also includes four main airflow paths 160a-160d. The main airflow path 160a is defined between the electronic component 120c and the top board 111, and also extends between the electronic component 120a and the first clapboard 113b. The cool air passing through the main path 160a cools the electronic components 120a and 120c in turn. The main airflow path 160b is defined between the electronic component 120c and the second clapboard 113a, and also extends between the electronic component 120a and the first clapboard 113c. The cool air passing through the main airflow path 160b also cools the electronic components 120a and 120c in turn.

The main airflow path 160c is defined between the electronic component 120d and the second clapboard 113a, and also extends between the electronic component 120b and the first clapboard 113d. The a cool air passing through the main airflow path 160c cools the electronic components 120b and 120d in turn. The main airflow path 160d is defined between the electronic component 120d and the bottom board 112, and also extends between the electronic component 120b and the first clapboard 113e. The cool air passing through the main airflow path 160d also cools the electronic components 120b and 120d in turn.

In one exemplary embodiment, widths of the four main airflow paths 160a-160d are about 1 mm-5 mm. In another exemplary embodiment, the widths of the four main airflow paths 160a-160d can be changed according to the size of the enclosure 110 and the electronic components 120a-120d.

The cooling system 120 also includes three auxiliary airflow paths 170a-170c. The auxiliary airflow path 170a is defined between the first clapboard 113b and the top board 111. An opening 180a is defined in a rear end of the auxiliary airflow path 170a, between the electronic components 120a and 120c. The cool air passing through the auxiliary airflow path 170a is directed to the main airflow path 160a through the opening 180a, to cool the electronic component 120c. Therefore, the electronic component 120c can be effectively cooled, because the cool air passing through the auxiliary airflow path 170a is not heated by the electronic component 120a.

The auxiliary airflow path 170b is defined between the first clapboards 113c and 113d. Two openings 180b and 180c are defined in a rear end of the auxiliary airflow path 170b, between the electronic components 120a and 120c. The cool air passing through the auxiliary airflow path 170b is directed to the main paths 160b and 160c through the openings 180b, 180c, to cool the electronic components 120c and 120d.

The auxiliary airflow path 170c is defined between the first clapboard 113e and the bottom board 112. An opening 180d is defined in a rear end of the auxiliary airflow path 170c, between the electronic components 120b and 120d. The cool air passing through the auxiliary airflow path 170c is directed to the main airflow path 160d through the opening 180d to cool the electronic component 120d. Therefore, the electronic components 120c and 120d can be effectively cooled, because the cool air passing through the auxiliary airflow paths 170a-170c is not heated by the electronic components 120a, 120b.

The plurality of air outlets 150 corresponds to the four main airflow paths 160a-160d and the auxiliary airflow paths 170a-170c, respectively. In one exemplary embodiment, widths of the three auxiliary airflow paths 170a-170c are about 1 mm-5 mm. In another exemplary embodiment, the widths of the three auxiliary airflow paths 170a-170b can be changed according to the size of the enclosure 110 and the electronic components 120a-120d.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. An electronic device, comprising:
a first electronic component;
a second electronic component;
an enclosure to receive the first and second electronic components, wherein the enclosure defines a plurality of air inlets to receive cool air to cool the first and second electronic components; and a plurality of air outlets to exhaust the cool air heated by the first and second electronic components, wherein the first electronic component is adjacent to the plurality of air inlets, and the second electronic component is aligned with the first electronic component, and adjacent to the plurality of air outlets;
a main airflow path defined in the enclosure and along a side of the first electronic component and the second electronic component, to allow a first flow of the cool air pass through the enclosure to cool the first electronic component and the second electronic component in turn;
a first clapboard;
an auxiliary airflow path defined in the enclosure and adjacent to the main airflow path, to allow a second flow of the cool air pass through the enclosure to cool the second electronic component; wherein the auxiliary airflow path is separated from the main airflow path by the first clapboard, and communicates with the main airflow path between the first electronic component and the second electronic component; and
at least one fan to blow the cool air passing through the enclosure out of the enclosure via the plurality of air outlets.

2. The electronic device of claim 1, wherein the enclosure includes a front board and a back board opposite to the front board; wherein the plurality of air inlets are defined in the front board, and the plurality of air outlets are defined in the back board.

3. The electronic device of claim 1, wherein the enclosure comprises a board module; the first clapboard is located in the board module and adjacent to the plurality of air inlets; the main airflow path is defined between the board module and the second electronic component, and further extends between the first clapboard and the first electronic component; the auxiliary airflow path is defined between the first clapboard and the board module.

4. The electronic device of claim 3, wherein the board module of the enclosure comprises a top board, a bottom board parallel to the top board, and a second clapboard arranged between and parallel to the top board and the bottom board.

5. The electronic device of claim 1, wherein the auxiliary airflow path comprises an opening in an end adjacent to the main airflow path of the auxiliary airflow path, to communicate with the main airflow path.

6. The electronic device of claim 1, wherein a width of the main airflow path is about 1 mm-5 mm.

7. The electronic device of claim 1, wherein a width of the auxiliary airflow path is about 1 mm-5 mm.

8. A cooling system, comprising:
an enclosure defining an air inlet to receive cool air to cool electronic components arranged in the enclosure, and an air outlet to exhaust the cool air heated by the electronic components out of the enclosure;
a main airflow path defined in the enclosure, and extending from the air inlet to the air outlet, to allow a first flow of the cool air from the air inlet pass through the enclosure and exhaust via the air outlet; and
an auxiliary airflow path defined in the enclosure, and extending from the air inlet towards the air outlet, wherein a first end of the auxiliary airflow path is communicated with the air inlet, a second end of the auxiliary airflow path is communicated with a rear segment adjacent to the air outlet of the main airflow path, to allow a second flow of the cool air from the air inlet pass through the auxiliary airflow path then enter into the rear segment of main airflow path.

9. The cooling system of claim 8, wherein the enclosure includes a front board and a back board; wherein the air inlet is defined in the front board, and the air outlet is defined in the back board.

10. The cooling system of claim 8, further comprising a first clapboard to separate a front segment adjacent to the air inlet of the main airflow path from the auxiliary airflow path.

11. The cooling system of claim 10, wherein the enclosure comprises a top board, a bottom board parallel to the top board, and a second clapboard between and parallel to the top board and the bottom board.

12. The cooling system of claim 8, wherein a width of the main airflow path is about 1 mm-5 mm.

13. The cooling system of claim 8, wherein a width of the auxiliary airflow path is about 1 mm-5 mm.

* * * * *